(12) United States Patent
Kondo et al.

(10) Patent No.: US 8,041,525 B2
(45) Date of Patent: Oct. 18, 2011

(54) SUBSTRATE MEASURING METHOD, COMPUTER-READABLE RECORDING MEDIUM RECORDING PROGRAM THEREON, AND SUBSTRATE MEASURING SYSTEM

(75) Inventors: Yoshihiro Kondo, Koshi (JP); Kunie Ogata, Kikuchigun (JP); Shinichi Shinozuka, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 400 days.

(21) Appl. No.: 11/856,308

(22) Filed: Sep. 17, 2007

(65) Prior Publication Data

US 2008/0074657 A1 Mar. 27, 2008

(30) Foreign Application Priority Data

Sep. 25, 2006 (JP) ................................. 2006-259618

(51) Int. Cl.
*G01N 21/00* (2006.01)
(52) U.S. Cl. ......................................................... 702/81
(58) Field of Classification Search ...................... 702/81
See application file for complete search history.

(56) References Cited

U.S. PATENT DOCUMENTS

| 6,392,434 B1 * | 5/2002 | Chiu ............................. 324/765 |
| 2004/0097063 A1 * | 5/2004 | Sakuma et al. ............... 438/616 |

FOREIGN PATENT DOCUMENTS

| JP | 2003-209093 | 7/2003 |
| JP | 2006-128572 | 5/2006 |
| WO | WO 2006/085527 A1 | 8/2006 |
| WO | WO 2006/087938 A1 | 8/2006 |
| WO | WO 2006/087955 A1 | 8/2006 |

OTHER PUBLICATIONS

Tadao Takeda, Methodology of Process Evaluation with Wafer-mapping Techniques for Statistical Process Control, Proc. IEEE 1994 Int. Conference on Microelectronic Test Structures, vol. 7, Mar. 1994, p. 85-89.*

* cited by examiner

*Primary Examiner* — Tung S Lau
(74) *Attorney, Agent, or Firm* — Oblon, Spivak, McClelland, Maier & Neustadt, L.L.P.

(57) ABSTRACT

In the present invention, for measurement of line widths, for example, at 36 locations within a substrate processed in a coating and developing treatment system, the 36 measurement points are divided and, for example, six substrates are used to measure the line widths at all of measurement points. In this event, the line widths at six measurement points are measured in each of the substrate, which exist in substrate regions different for each substrate. Then, the measurement results of the line widths at the measurement points of the substrates are combined, so that the line widths at 36 measurement points are finally detected. According to the present invention, the measurements of product substrates can be performed without decreasing the throughput of processing of the product substrates.

7 Claims, 10 Drawing Sheets

| MEASUREMENT POINT | $Q_1$ | $Q_2$ | $Q_3$ | $Q_4$ | $Q_5$ | $Q_6$ |
|---|---|---|---|---|---|---|
| PEB UNIT 84 | $W_1$ | $W_7$ | $W_{13}$ | $W_{19}$ | $W_{25}$ | $W_{31}$ |
| PEB UNIT 85 | $W_2$ | $W_8$ | $W_{14}$ | $W_{20}$ | $W_{26}$ | $W_{32}$ |
| PEB UNIT 86 | $W_3$ | $W_9$ | $W_{15}$ | $W_{21}$ | $W_{27}$ | $W_{33}$ |
| PEB UNIT 87 | $W_4$ | $W_{10}$ | $W_{16}$ | $W_{22}$ | $W_{28}$ | $W_{34}$ |
| PEB UNIT 88 | $W_5$ | $W_{11}$ | $W_{17}$ | $W_{23}$ | $W_{29}$ | $W_{35}$ |
| PEB UNIT 89 | $W_6$ | $W_{12}$ | $W_{18}$ | $W_{24}$ | $W_{30}$ | $W_{36}$ |

SUBSTRATE MEASURING METHOD, COMPUTER-READABLE RECORDING MEDIUM RECORDING PROGRAM THEREON, AND SUBSTRATE MEASURING SYSTEM

BACKGROUND OF THE INVENTION

1. Field of the Invention

The present invention relates to a substrate measuring method, a computer-readable recording medium recording a program thereon, and a substrate measuring system.

2. Description of the Related Art

In a photolithography process in manufacturing, for example, a semiconductor device, for example, a plurality of steps such as a resist coating step of applying a resist solution onto a wafer to form a resist film, an exposure step of exposing the resist film into a predetermined pattern, heating step of accelerating the chemical reaction in the resist film after exposure (post-exposure baking), and a developing step of developing the exposed resist film are performed in sequence, so that a predetermined resist pattern is formed on the wafer. The series of processing is performed in a coating and developing treatment system incorporating various kinds of processing and treatment units and wafer transfer units, in which, for example, a plurality of wafers for the same recipe are successively transferred and processed.

Incidentally, to grasp, for example, the processing tendency within the wafer of the series of processing, it is necessary to measure the processing state of the wafer such as the line width of the resist pattern after the wafer processing in the above-described coating and developing treatment system. The measurement of the wafer is performed by processing a test wafer before processing of a product wafer, for example, in the coating and developing treatment system and measuring the processing states at a plurality of measurement points on the test wafer, for example, by a measuring unit incorporated in the coating and developing treatment system (see Japanese Patent Application Laid-open No. 2006-128572 and JP No. 2003-209093).

However, when the wafer processing state is measured using the test wafer as described above, it takes a long time to start processing of the product wafer. For this reason, it is considered to directly measure the processing state using the product wafer.

However, the product wafers are transferred in succession by a plurality of wafers for each lot in the coating and developing treatment system. Therefore, if a product wafer is measured at many points after the product wafer has been subjected to the last step, it takes a long time for the measurement, causing waiting time of other product wafers subsequent thereto. This causes congestion of the product wafers transferred in succession, resulting in decreased throughput of the wafer processing.

SUMMARY OF THE INVENTION

The present invention has been developed in consideration of the above points, and its object is to measure product wafers transferred in succession without decreasing the throughput.

To achieve the above object, the present invention is a measuring method of measuring processing states of a plurality of substrates, the substrates having been successively transferred and subjected to processing, in which for measurement of the processing states at a plurality of measurement points within the substrate, the plurality of measurement points within the substrate are divided in advance. The method includes the processes of: performing the measurements at the divided measurement points for different substrates for each of the measurement points; and then combining measurement results at the measurement points of the substrates.

According to the present invention, the plurality of measurement points within the substrate are divided in advance, the measurements at the divided measurement points are performed using different substrates for each of the measurement points, and measurement results at the measurement points of the substrates are combined, so that the measurement time for each substrate can be shortened. As a result, in the case where a plurality of substrates are successively transferred and processed, occurrence of delay in the transfer of substrates because the previous substrate under measurement keeps subsequent substrates waiting can be prevented. Accordingly, the measurement of the product substrate can be performed without decreasing the throughput of the substrate processing.

The procedure of executing the measuring method of the present invention is computer-programmed, stored in a computer-readable recording medium, and applied to a measuring system for performing the measurement of the substrate.

According to another aspect, the present invention is a substrate measuring system for measuring processing states of a plurality of substrates, the substrates having been successively transferred and subjected to processing. The system includes a measuring unit for measuring processing states of a substrate at a plurality of measurement points within the substrate, and a control unit for dividing the plurality of measurement points within the substrate in advance, performing the measurements at the divided measurement points using different substrates for each of the measurement points, and combining measurement results at the measurement points of the substrates.

According to the present invention, the measurement of a product substrate can be performed without decreasing the throughput.

DETAILED DESCRIPTION OF THE INVENTION

Figure 1:
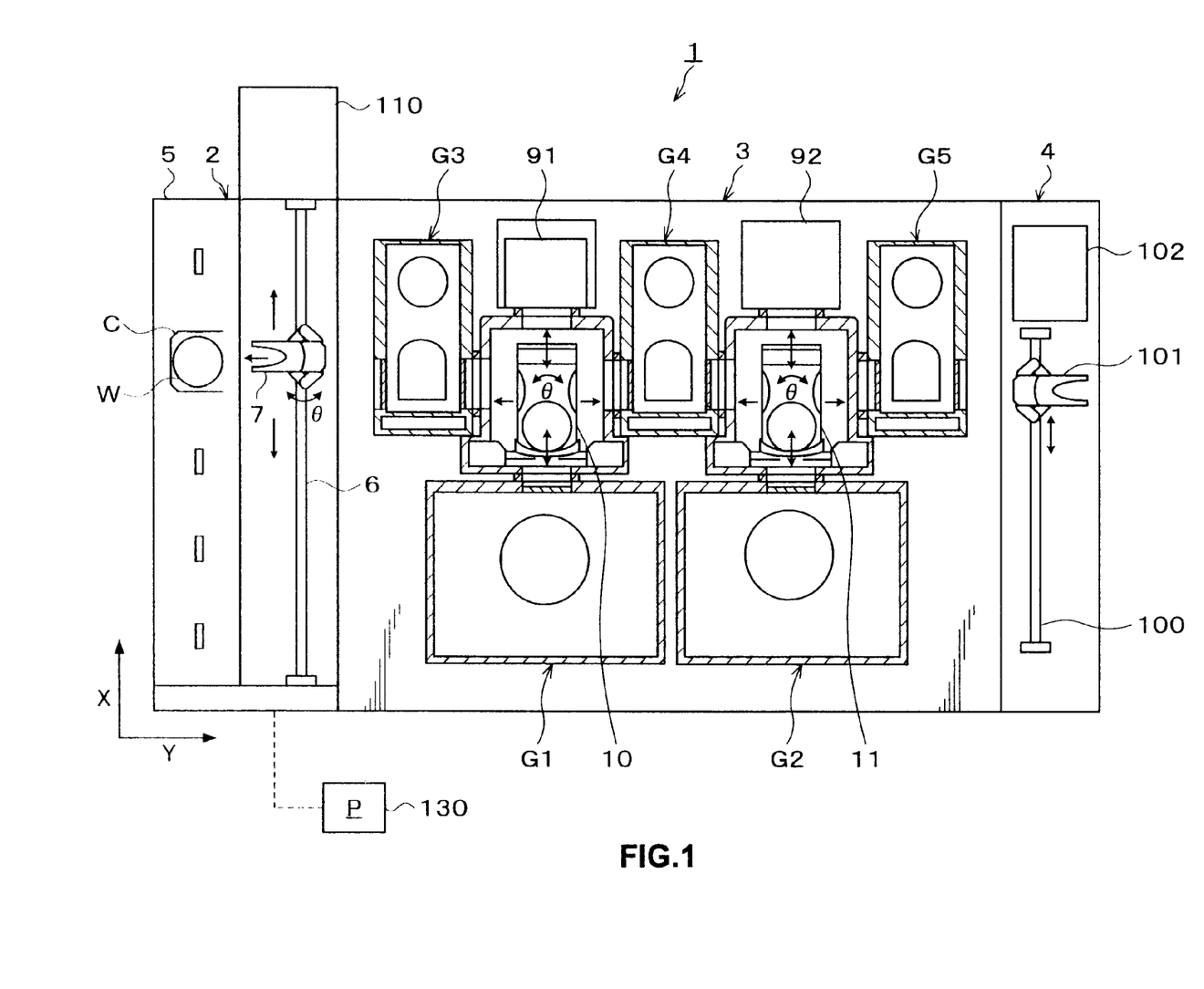
FIG. 1 is a plan view showing the outline of a configuration of a coating and developing treatment system.
Figure 2:
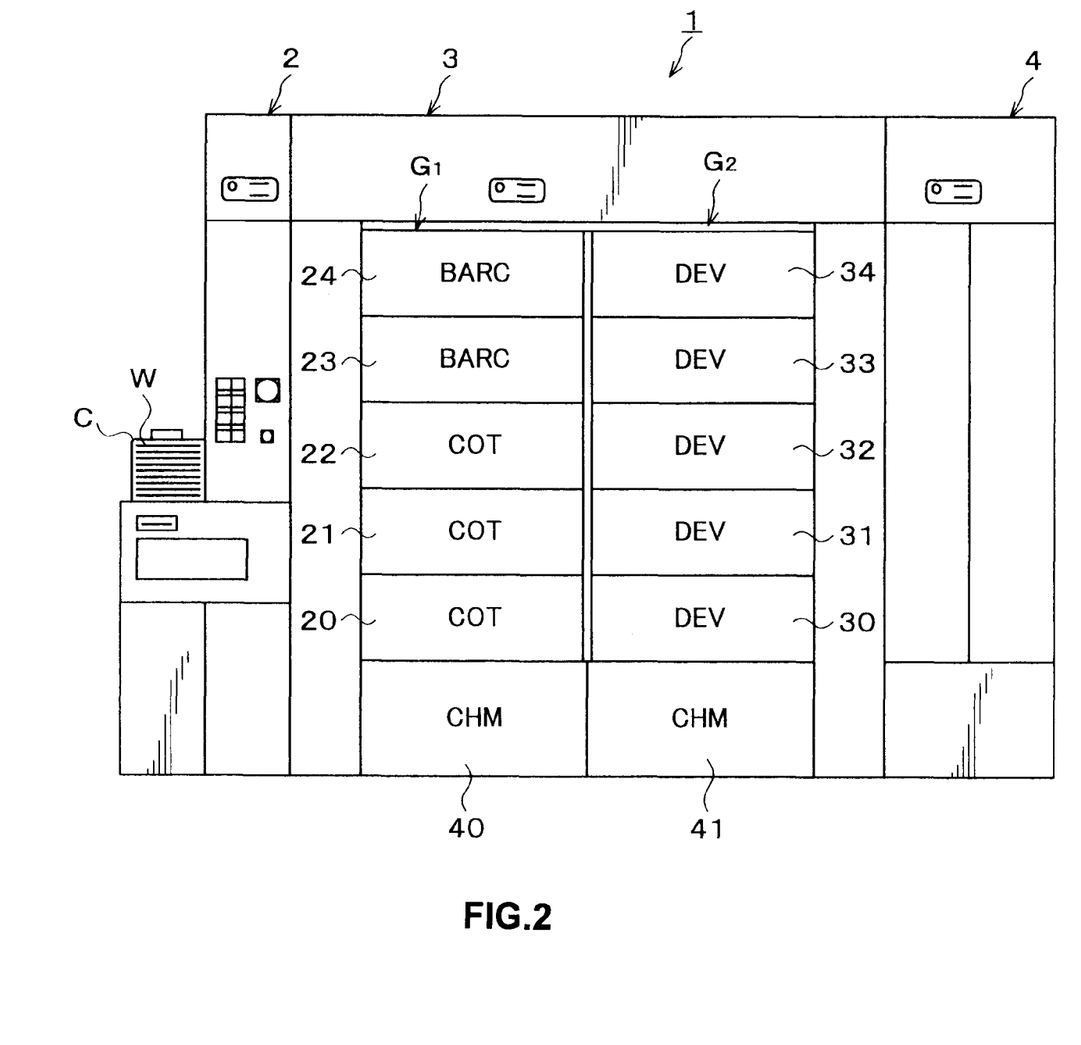
FIG. 2 is a front view of the coating and developing treatment system in FIG. 1.
Figure 3:
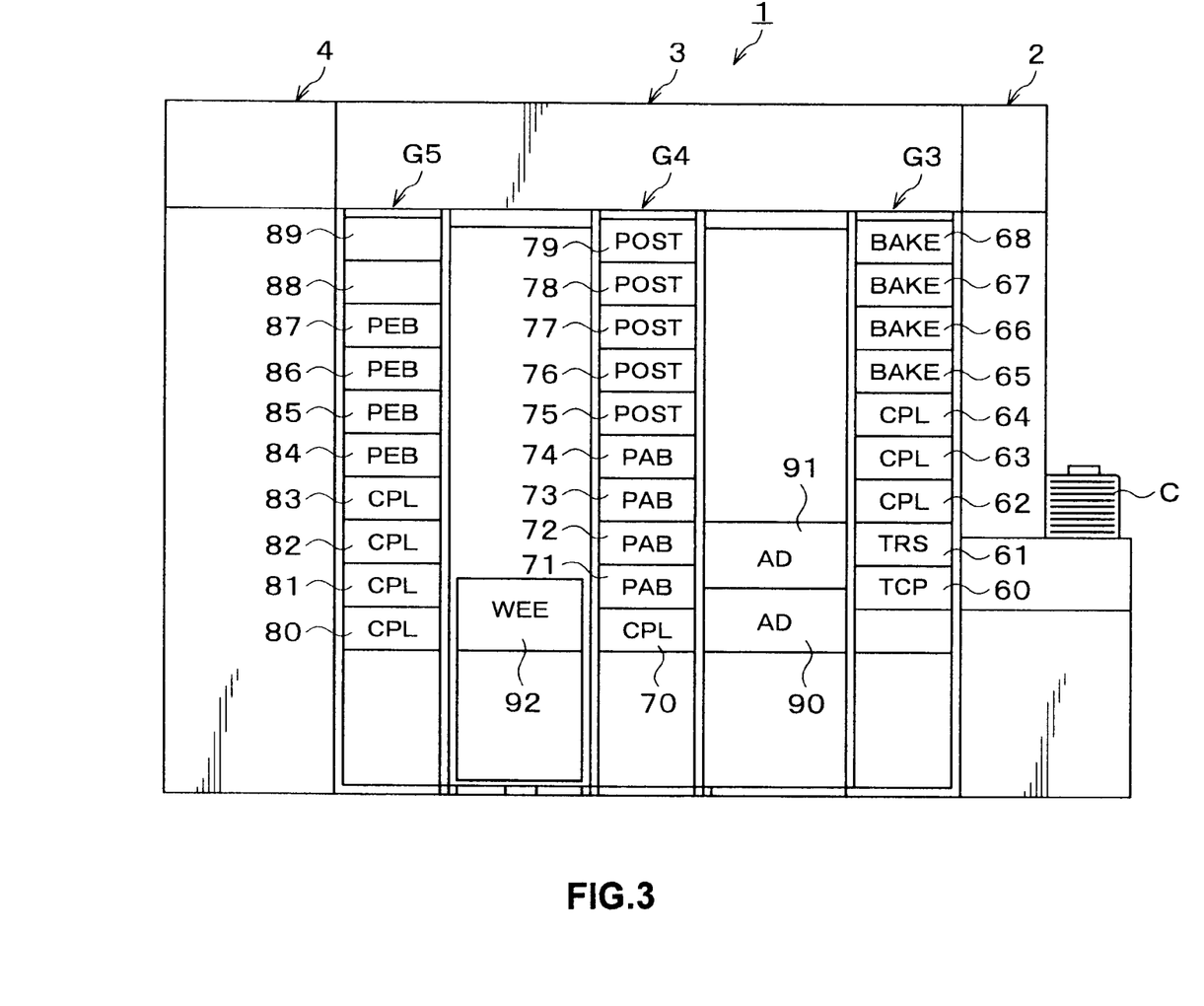
FIG. 3 is a rear view of the coating and developing treatment system in FIG. 1.

Hereinafter, a preferred embodiment of the present invention will be described. FIG. 1 is a plan view showing the outline of a configuration of a coating and developing treatment system 1 in which a substrate measuring method according to the embodiment is performed, FIG. 2 is a front view of the coating and developing treatment system 1, and FIG. 3 is a rear view of the coating and developing treatment system 1.

The coating and developing treatment system 1 has, as shown in FIG. 1, a configuration in which, for example, a cassette station 2 for transferring, for example, 25 wafers W per cassette as a unit from/to the outside into/from the coating and developing treatment system 1 and transferring the wafers W into/out of a cassette C; a processing station 3 including a plurality of various kinds of processing and treatment units, which are multi-tiered, for performing predetermined processing or treatment in a manner of single wafer processing in the photolithography process; and an interface station 4 for delivering the wafers W to/from a not-shown aligner provided adjacent to the processing station 3, are integrally connected together.

In the cassette station 2, a cassette mounting table 5 is provided and configured such that a plurality of cassettes C can be mounted thereon in a line in an X-direction (a top-to-bottom direction in FIG. 1). In the cassette station 2, a wafer transfer body 7 is provided which is movable in the X-direction on a transfer path 6. The wafer transfer body 7 is also movable in an arrangement direction of the wafers W housed in the cassette C (a Z-direction; the vertical direction), and thus can selectively access the wafers W in each of the cassettes C arranged in the X-direction.

The wafer transfer body 7 is rotatable in a θ-direction around a Z-axis, and can access a temperature regulating unit 60 and a transition unit 61 included in a later-described third processing unit group G3 on the processing station 3 side.

The processing station 3 adjacent to the cassette station 2 includes, for example, five processing unit groups G1 to G5 in each of which a plurality of processing and treatment units are multi-tiered. On the side of the negative direction in the X-direction (the downward direction in FIG. 1) in the processing station 3, the first processing unit group G1 and the second processing unit group G2 are placed in order from the cassette station 2 side. On the side of the positive direction in the X-direction (the upward direction in FIG. 1) in the processing station 3, the third processing unit group G3, the fourth processing unit group G4, and the fifth processing unit group G5 are placed in order from the cassette station 2 side. Between the third processing unit group G3 and the fourth processing unit group G4, a first transfer unit 10 is provided.

The first transfer unit 10 can selectively access the processing and treatment units in the first processing unit group G1, the third processing unit group G3, and the fourth processing unit group G4 and transfer the wafer W to them. Between the fourth processing unit group G4 and the fifth processing unit group G5, a second transfer unit 11 is provided. The second transfer unit 11 can selectively access the processing and treatment units in the second processing unit group G2, the fourth processing unit group G4, and the fifth processing unit group G5 and transfer the wafer W to them.

In the first processing unit group G1, as shown in FIG. 2, solution treatment units each for supplying a predetermined liquid to the wafer W to perform treatment, for example, resist coating units 20, 21, and 22 each for applying a resist solution to the wafer W, and bottom coating units 23 and 24 each for forming an anti-reflection film that prevents reflection of light at the time of exposure processing, are five-tiered in order from the bottom. In the second processing unit group G2, solution treatment units, for example, developing treatment units 30 to 34 each for supplying a developing solution to the wafer W to develop it are five-tiered in order from the bottom. Further, chemical chambers 40 and 41 for supplying various kinds of treatment solutions to the solution treatment units in the processing unit groups G1 and G2 are provided at the lowermost tiers of the first processing unit group G1 and the second processing unit group G2, respectively.

As shown in FIG. 3, in the third processing unit group G3, for example, the temperature regulating unit 60, the transition unit 61 for passing the wafer W, high-precision temperature regulating units 62 to 64 each for regulating the temperature of the wafer W under a high precision temperature control, and high-temperature thermal processing units 65 to 68 each for heat-processing the wafer W at a high temperature, are nine-tiered in order from the bottom.

In the fourth processing unit group G4, for example, a high-precision temperature regulating unit 70, pre-baking units 71 to 74 each for heat-processing the wafer W after resist coating treatment, and post-baking units 75 to 79 each for heat-processing the wafer W after developing treatment, are ten-tiered in order from the bottom.

In the fifth processing unit group G5, a plurality of thermal processing units each for thermally processing the wafer W, for example, high-precision temperature regulating units 80 to 83, and post-exposure baking units (hereinafter, referred to as "PEB units") 84 to 89 each for heat-processing the wafer W after exposure and before development, are ten-tiered in order from the bottom.

As shown in FIG. 1, on the positive direction side in the X-direction to the first transfer unit 10, a plurality of processing and treatment units are arranged, for example, adhesion units 90 and 91 each for performing hydrophobic treatment on the wafer W being two-tiered in order from the bottom as shown in FIG. 3. As shown in FIG. 1, on the positive side in the X-direction to the second transfer unit 11, for example, an edge exposure unit 92 is disposed which selectively exposes only the edge portion of the wafer W to light.

In the interface station 4, for example, a wafer transfer body 101 moving on a transfer path 100 extending in the X-direction and a buffer cassette 102 are provided as shown in FIG. 1. The wafer transfer body 101 is movable in the vertical direction and also rotatable in the θ-direction, and thus can access the not-shown aligner adjacent to the interface station 4, the buffer cassette 102, and the fifth processing unit group G5 and transfer the wafer W to them.

Figure 4:
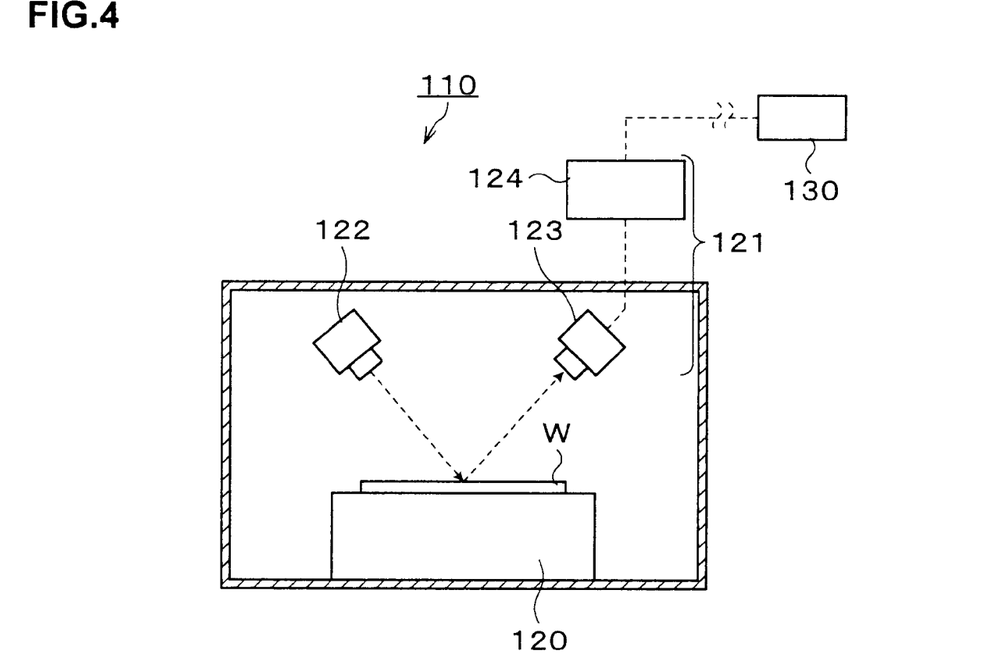
FIG. 4 is a longitudinal-sectional view showing the outline of a configuration of a line width measuring unit.

In the cassette station 2, for example, a line width measuring unit 110 for measuring the line width of a resist pattern on the wafer W is provided. The line width measuring unit 110 includes, for example, a mounting table 120 for horizontally mounting the wafer W thereon as shown in FIG. 4 and an optical profilometer 121.

The mounting table 120 forms, for example, an X-Y stage and can move in two dimensional directions in the horizontal directions. The optical profilometer 121 includes, for example, a light irradiation unit 122 for applying light to the wafer W from an oblique direction, a light detection unit 123 for detecting the light applied from the light irradiation unit 122 and reflected by the wafer W, and a calculation unit 124 for calculating the dimension of the resist pattern on the wafer W based on light reception information from the light detection unit 123.

The line width measuring unit 110 according to this embodiment is for measuring the line width of the resist pattern, for example, using the Scatterometry method, in which the line width of the resist pattern can be measured in the calculation unit 124 by checking the light intensity distribution within the wafer detected by the light detection unit 123 against a virtual light intensity distribution stored in advance and obtaining a line width of the resist pattern corresponding to the checked virtual light intensity distribution.

Figure 5:
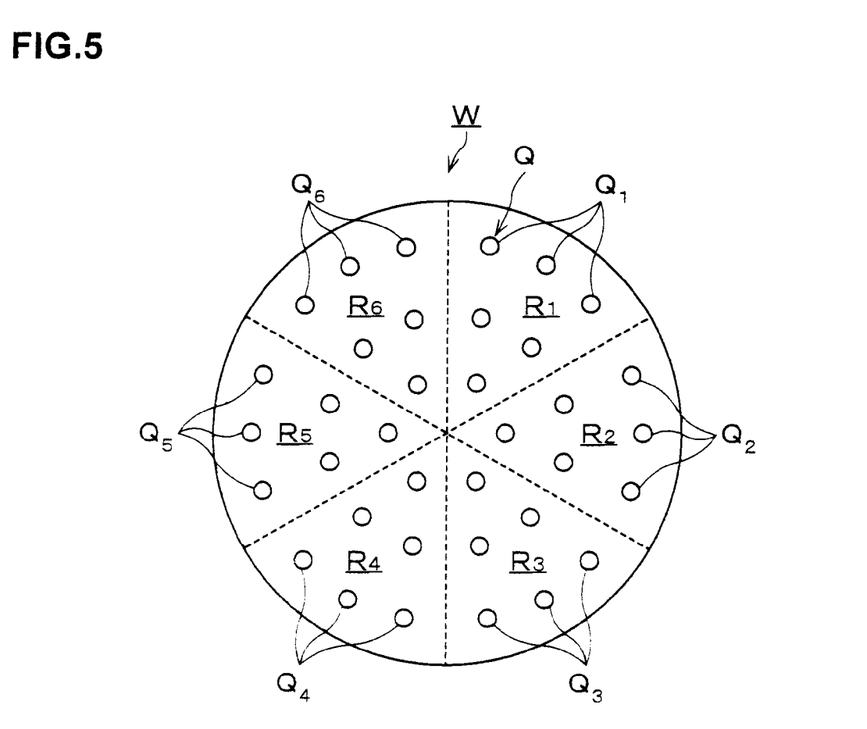
FIG. 5 is an explanatory view showing divided regions of a plurality of measurement points within a wafer.

The line width measuring unit 110 can measure the line widths at a plurality of locations within the wafer, for example, at a plurality of measurement points Q as shown in FIG. 5 by horizontally moving the wafer W relative to the light irradiation unit 122 and the light detection unit 123. The measurement result of the line width measuring unit 110 can be outputted, for example, from the calculation unit 124 to a later-described control unit 130.

The wafer processing performed in the coating and developing treatment system 1 configured as described above is controlled, for example, by the control unit 130 shown in FIG. 1. The control unit 130 also controls the measurement of the line width of the wafer W. The control unit 130 is composed of, for example, a general-purpose computer comprising a CPU and a memory, and can execute a program P stored therein to control the wafer processing and the line width measurement. The program P in the control unit 130 may be one installed into the control unit 130 by means of a computer-readable recording medium.

In this embodiment, for example, the control unit 130 and the line width measuring unit 110 constitute a substrate measuring system.

Next, the process of processing the wafer and the process of measuring the line widths within the wafer in the coating and developing treatment system 1 configured as described above will be described. A plurality of product wafers Wn (where n is a natural number equal to or greater than 1) for the same recipe are first taken out one by one from the cassette C on the cassette mounting table 5 by the wafer transfer body 7 shown in FIG. 1, and transferred in succession to the temperature regulating unit 60 included in the third processing unit group G3 in the processing station 3.

The wafer Wn transferred to the temperature regulating unit 60 is temperature-regulated to a predetermined temperature, and is then transferred by the first transfer unit 10 to the bottom coating unit 23, where an anti-reflection film is formed thereon. The wafer Wn having the anti-reflection film formed thereon is transferred by the first transfer unit 10 to the high-temperature thermal processing unit 65 and the high-precision temperature regulating unit 70 in sequence so that predetermined processing is performed in each of the units. Thereafter, the wafer Wn is transferred to the resist coating unit 20 where a resist film is formed on the wafer W, and then transferred by the first transfer unit 10 to the pre-baking unit 71 and subjected to pre-baking. The wafer Wn is subsequently transferred by the second transfer unit 11 to the edge exposure unit 92 and the high-precision temperature regulating unit 83 in sequence so that the wafer W is subjected to predetermined processing in each of the units. The wafer Wn is then transferred by the wafer transfer body 101 in the interface station 4 to the not-shown aligner, where the wafer is exposed to light.

The wafer Wn for which exposure processing has been finished is transferred by the wafer transfer body 101, for example, to the PEB unit 84, where the wafer W is subjected to post-exposure baking, and then transferred by the second transfer unit 11 to the high-precision temperature regulating unit 81, where the wafer Wn is temperature-regulated. The wafer Wn is transferred to the developing treatment unit 30, where the resist film on the wafer W is developed. The wafer Wn is then transferred by the second transfer unit 11 to the post-baking unit 75, where the wafer W is subjected to post-baking. The wafer Wn is then transferred to the high-precision temperature regulating unit 63, where the wafer W is temperature-regulated. The wafer Wn is then transferred by the first transfer unit 10 to the transition unit 61 and returned to the cassette C by the wafer transfer body 7, thus completing a series of wafer processing.

The wafers Wn for which the series of wafer processing has been finished are transferred by the wafer transfer body 7 in succession to the line width measuring unit 110 in the cassette station 2.

For example, a first wafer $W_1$ of the plurality of wafers Wn is first transferred to the line width measuring unit 110 and mounted on the mounting table 120 as shown in FIG. 4. Then, light is applied from the light irradiation unit 122 to a predetermined portion of the front surface of the wafer $W_1$, its reflected light is detected by the light detection unit 123, and the line width of the resist pattern on the wafer $W_1$ is calculated in the calculation unit 124. In this line width measuring unit 110, the wafer $W_1$ is horizontally moved relative to the light irradiation unit 122 and the light detection unit 123, so that the line widths at measurement points $Q_1$ that are, for example, part of 36 measurement points Q evenly arranged within the wafer as shown in FIG. 5 are measured. In this embodiment, the line widths at six measurement points $Q_1$ in a wafer region $R_1$ are measured that is one of equally divided six fan-like parts of the wafer surface. The measurement result for the wafer $W_1$ is outputted to the control unit 130.

After completion of the line width measurement for the wafer $W_1$, the next wafer $W_2$ is transferred to the line width measuring unit 110, and the line widths at six measurement points $Q_2$ in a wafer region $R_2$ shown in FIG. 5, difference from those of the case for the wafer $W_1$, are measured. The measurement result for the wafer $W_2$ is outputted to the control unit 130.

After completion of the line width measurement for the wafer $W_2$, the next wafer $W_3$ is transferred to the line width measuring unit 110, and the line widths at six measurement points $Q_3$ in a wafer region $R_3$ shown in FIG. 5, difference from those of the case for the wafers $W_1$ and $W_2$, are measured. The measurement result for the wafer $W_3$ is outputted to the control unit 130.

In such a manner, the next wafer $W_4$, wafer $W_5$, and wafer $W_6$ are transferred in succession to the line width measuring unit 110, and the line widths at respective six measurement points $Q_4$, $Q_5$, and $Q_6$ in respective wafer regions $R_4$, $R_5$, and $R_6$ shown in FIG. 5, difference from each other, are measured. The measurement results for the wafers $W_4$ to $W_6$ are outputted to the control unit 130. Thus, the line widths at the measurement points $R_1$ to $R_6$ of six wafers $W_1$ to $W_6$ are separately measured, whereby the measurement of the line widths at all of the measurement points Q ($Q=Q_1+Q_2+Q_3+Q_4+Q_5+Q_6$) within the wafer is performed.

The wafers $W_1$ to $W_6$ for which line width measurement has been finished are returned in succession to the cassette C in the cassette station 2.

Figure 6:
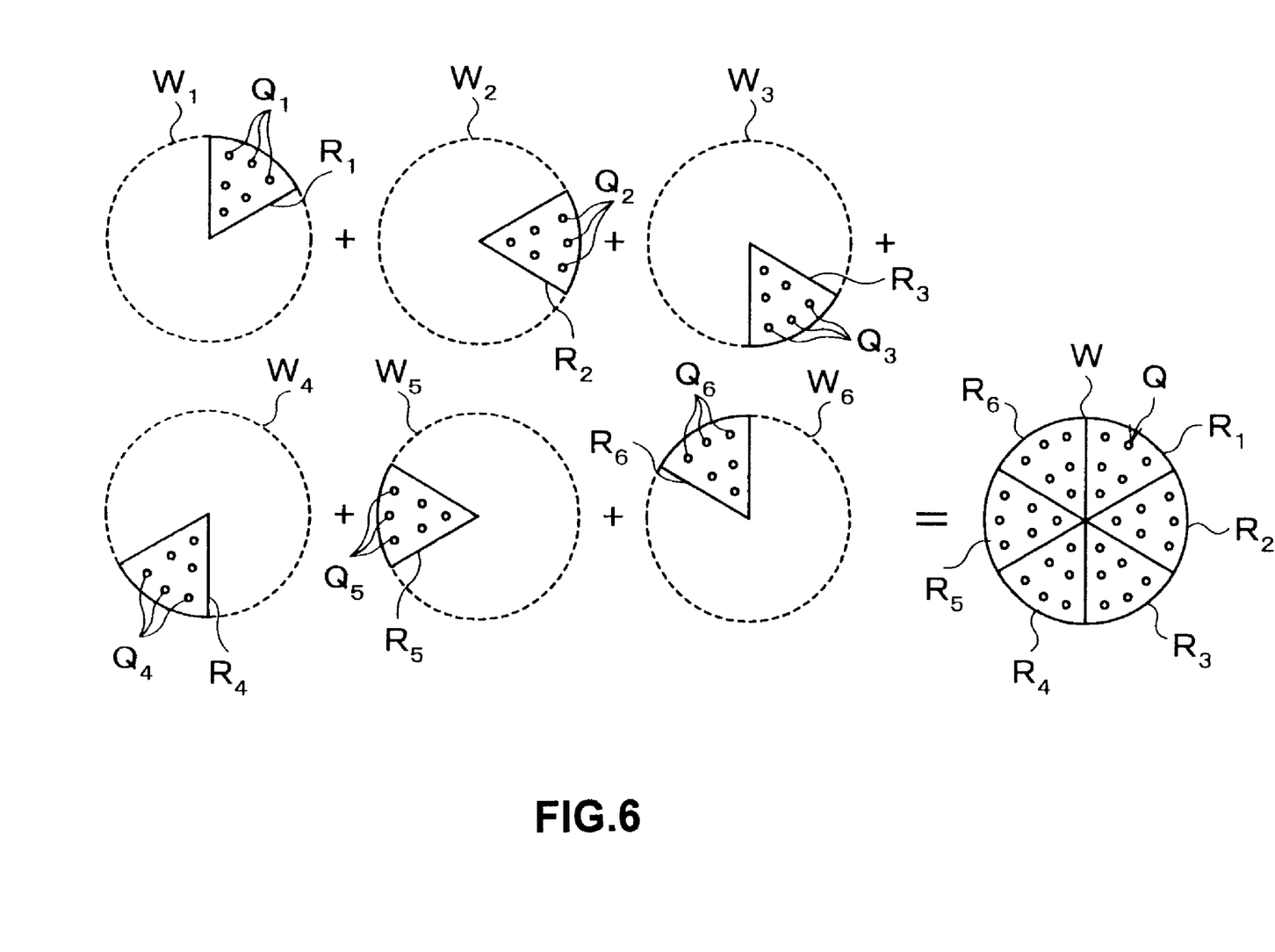
FIG. 6 is an explanatory view showing an example to combine measurement results of six wafers.

In the control unit 130 to which the measurement results are outputted, the line width measurement results at the measurement points $Q_1$ to $Q_6$ of the wafers $W_1$ to $W_6$ are added and combined as shown in FIG. 6 to obtain the measurement results at 36 measurement points Q over the entire wafer surface.

According to the above embodiment, the line width measurement at 36 locations within the wafer is dividedly performed using six wafers $W_1$ to $W_6$, so that measurement time for the wafers $W_1$ to $W_6$ is shorter than that in the case when the line width measurement is performed at 36 locations using one wafer. Thus, it can be prevented that in the wafer processing in which a plurality of wafers Wn are transferred in succession, a long time is taken to measure the line widths for a preceding wafer Wn to cause waiting time of a subsequent wafer Wn, thereby preventing congestion of wafers Wn. As a result, even if both a series of processing and line width measurement are performed using the product wafers, the throughput of the wafer processing is never decreased.

While the line widths are measured only at measurement points which are different among the wafers $W_1$ to $W_6$ in the above embodiment, a measurement point common to the wafers $W_1$ to $W_6$ may be provided.

Figure 7:
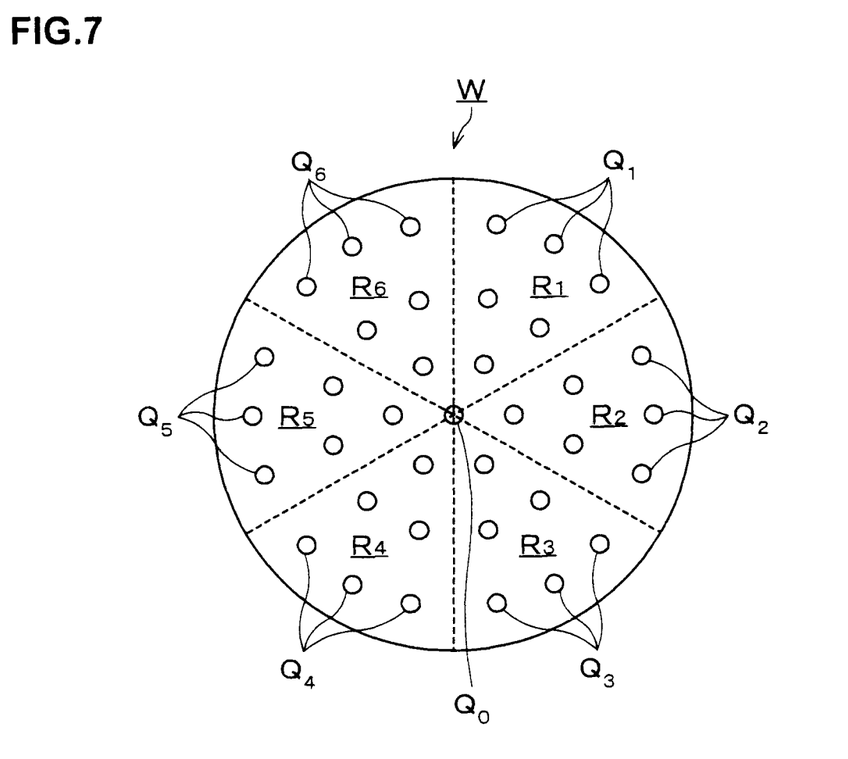
FIG. 7 is an explanatory view showing a common measurement point at the center within the wafer.

In this case, a common measurement point $Q_0$ is provided, for example, at the center of the wafer W as shown in FIG. 7. The line width at the common measurement point $Q_0$ is measured for each of the wafers $W_1$ to $W_6$ in the line width measurements of the above-described wafers $W_1$ to $W_6$.

Figure 8:
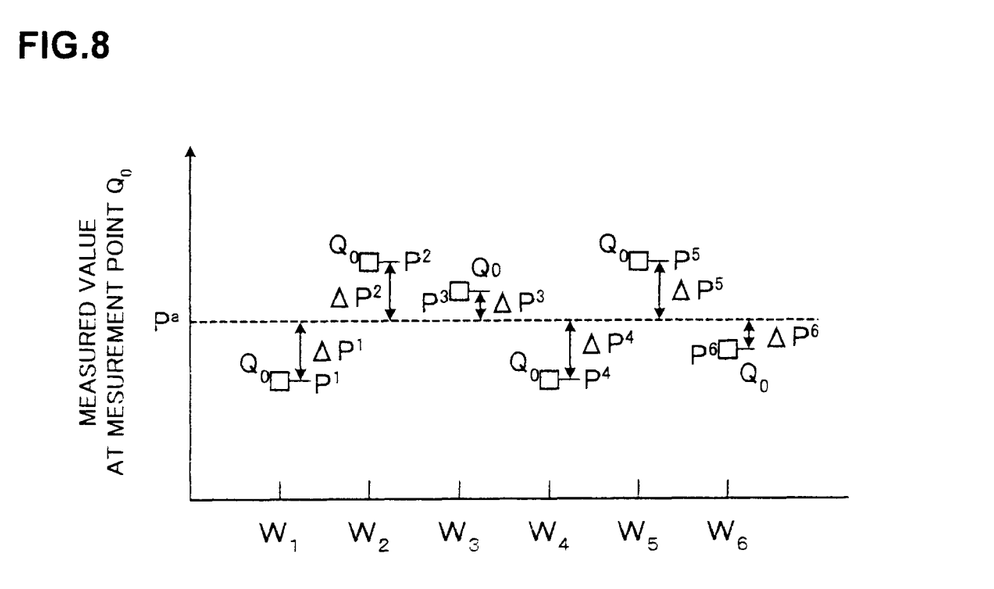
FIG. 8 is a graph showing measured values at the measurement point common to six wafers.

The line width measurement results at the measurement points $Q_0$ of the wafers $W_1$ to $W_6$ are outputted to the control unit 130. In the control unit 130, for example, line width measured values p1, p2, p3, p4, p5, and p6 at the measurement points $Q_0$ of the wafers $W_1$ to $W_6$ as shown in FIG. 8 are used to calculate an average value pa of them. Then, differences between the average value pa and the line width measured values p1 to p6, that is, Δp1, Δp2, Δp3, Δp4, Δp5, and Δp6 are calculated.

Thereafter, the above-described measured values at the measurement points $Q_1$ to $Q_6$ of the wafers $W_1$ to $W_6$ are corrected by the differences Δp1 to Δp6, whereby the line width measurement results at the measurement points Q within the wafer are corrected. In this case, since the measurement errors occurring among the wafers $W_1$ to $W_6$ can be corrected, the line width measurement within the wafer can be performed more accurately. Note that the position of the common measurement point $Q_0$ is not limited to the center within the wafer but may be another position within the wafer. Further, a plurality of common measurement points may be provided.

In the case where a plurality of processing units are provided for use in the same processing step in which the wafers Wn transferred in succession are separately processed in the plurality of processing units in the above embodiment, the line width measurements at the above-described divided measurement points $Q_1$ to $Q_6$ may be performed using a plurality of wafers Wn processed in the same processing unit, and the measurement results of the wafers Wn may be combined.

Figure 9:
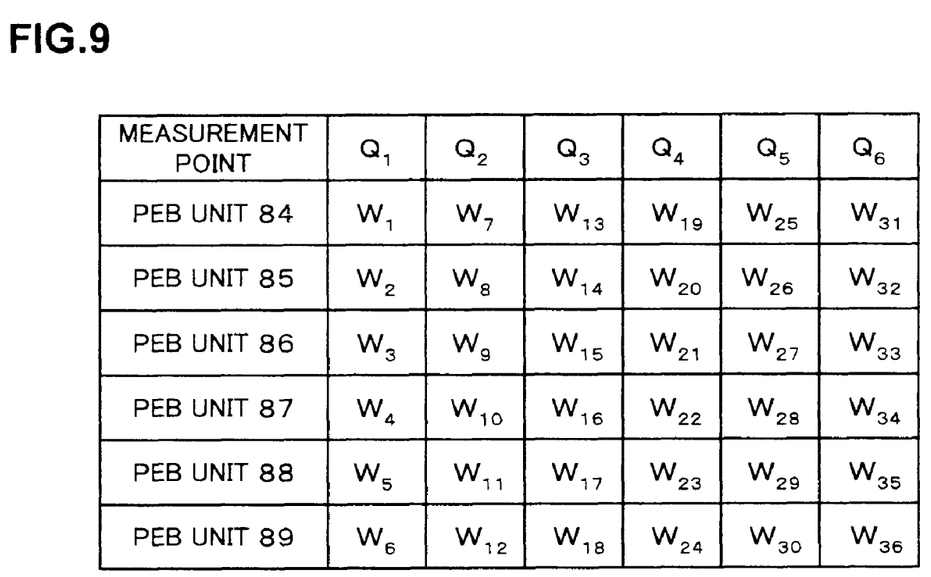
FIG. 9 is a table showing wafers to be transferred into PEB units.

For example, when six PEB units 84 to 89 are provided as described above and, for example, 36 wafers Wn are separated in sequence into the PEB units 84 to 89 as shown in FIG. 9, six wafers Wn in total, which are taken every sixth wafers Wn processed in the same PEB unit (for example, wafers $W_1$, $W_7$, $W_{13}$, $W_{19}$, $W_{25}$ and $W_{31}$ for the PEB unit 84), are subjected in sequence to line width measurements at the measurement points $Q_1$, $Q_2$, $Q_3$, $Q_4$, $Q_5$, and $Q_6$. The measurement results at the measurement points $Q_1$ to $Q_6$ of the six wafers Wn in total processed in the same PEB unit are combined to obtain the line width measurement results within the wafer for each PEB unit. In this case, comparison of the line width measurement results among the PEB units allows the processing characteristics of each PEB unit to be grasped. Note that the number of PEB units and the order of transfer of the wafers Wn to the PEB units are not limited to those of this example. Further, this example is also applicable to processing units other than the PEB unit.

The line width measurements within the wafer described in the above embodiment may be performed, for example, for adjustment of the set temperature of the thermal processing plate in the thermal processing unit. To explain this example, a configuration of, for example, the PEB unit 84 as the thermal processing unit will be described first.

Figure 10:
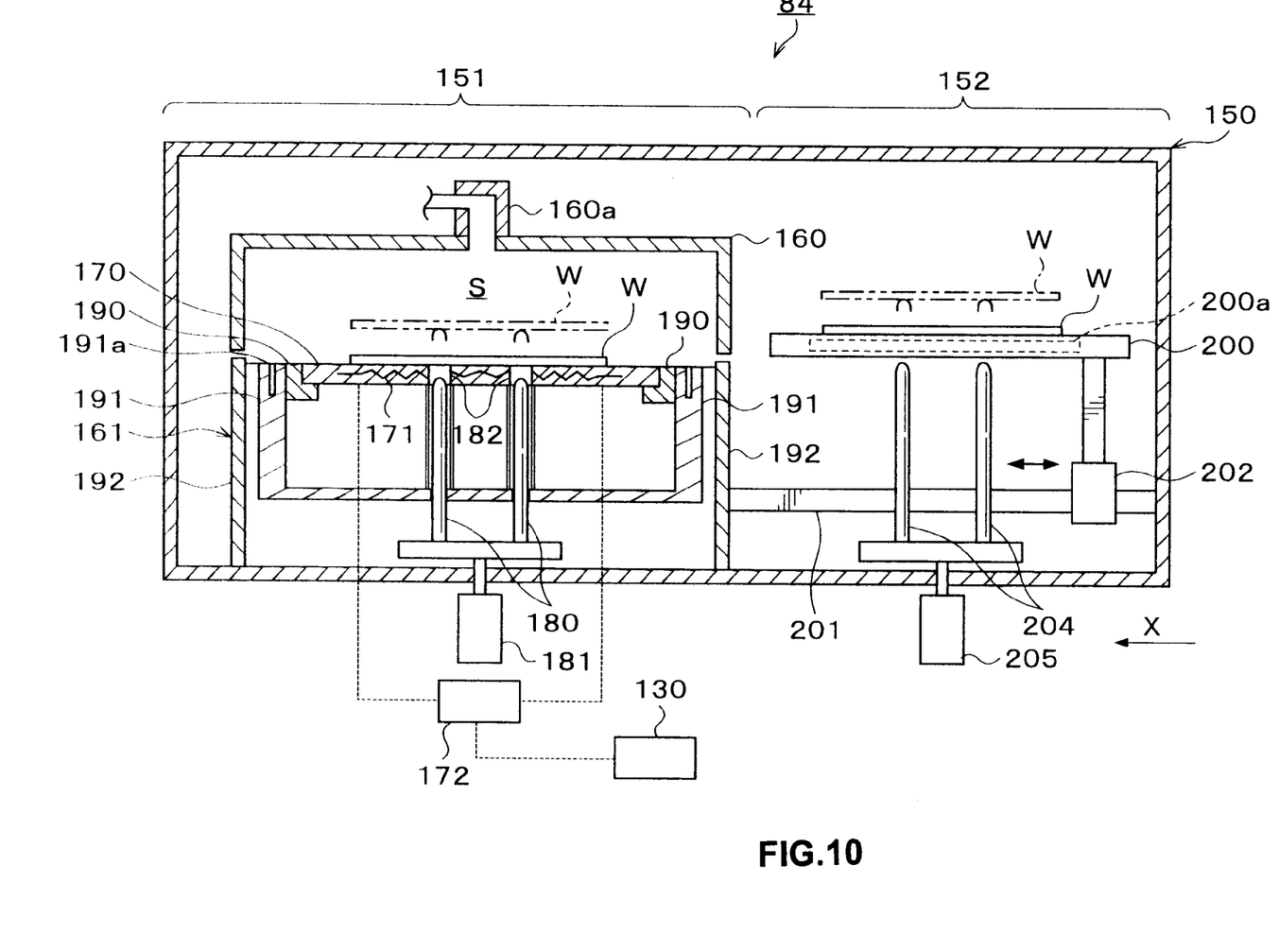
FIG. 10 is an explanatory view of a longitudinal section showing the outline of a configuration of the PEB unit.
Figure 11:
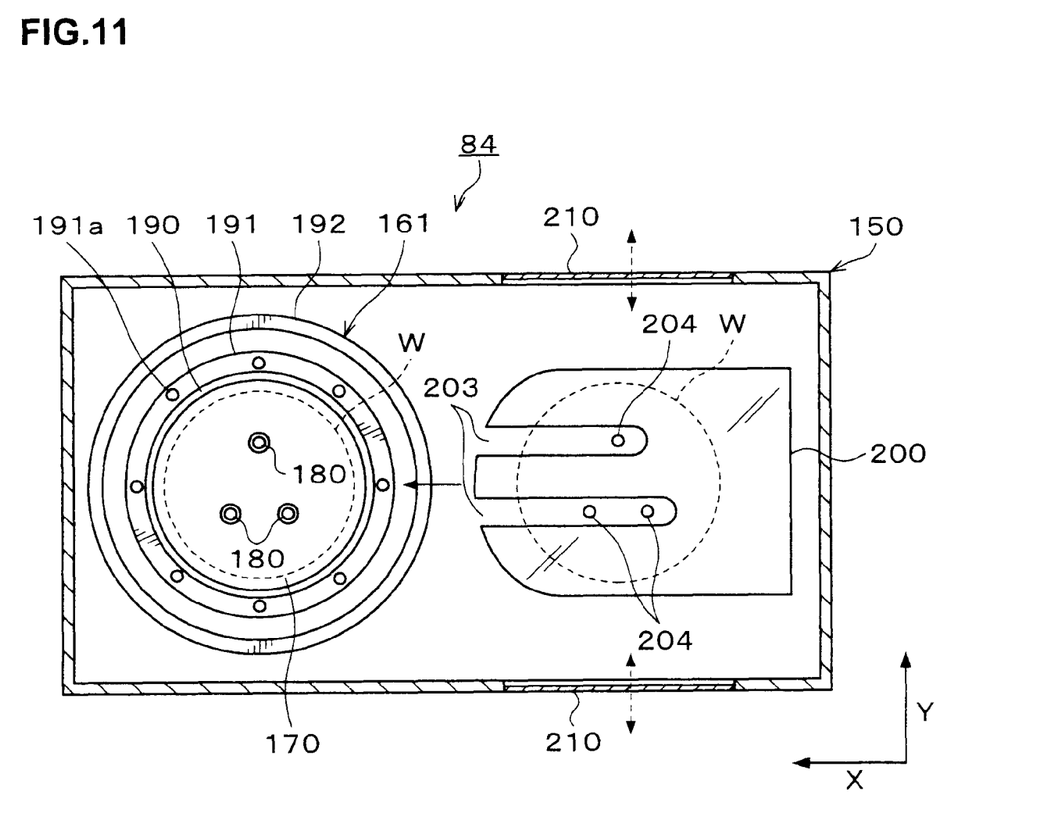
FIG. 11 is an explanatory view of a transverse section showing the outline of a configuration of the PEB unit.

The PEB unit 84 comprises, as shown in FIG. 10 and FIG. 11, a heating section 151 for heating-processing the wafer W and a cooling section 152 for cooling-processing the wafer W in a housing 150.

The heating section 151 has, as shown in FIG. 10, a lid body 160 that is located on the upper side and vertically movable, and a thermal plate accommodating unit 161 that is located on the lower side and forms a processing chamber S together with the lid body 160. The lid body 160 is provided with an exhaust portion 160a at its ceiling portion so that the atmosphere in the processing chamber S is uniformly exhausted through the exhaust portion 160a.

Figure 12:
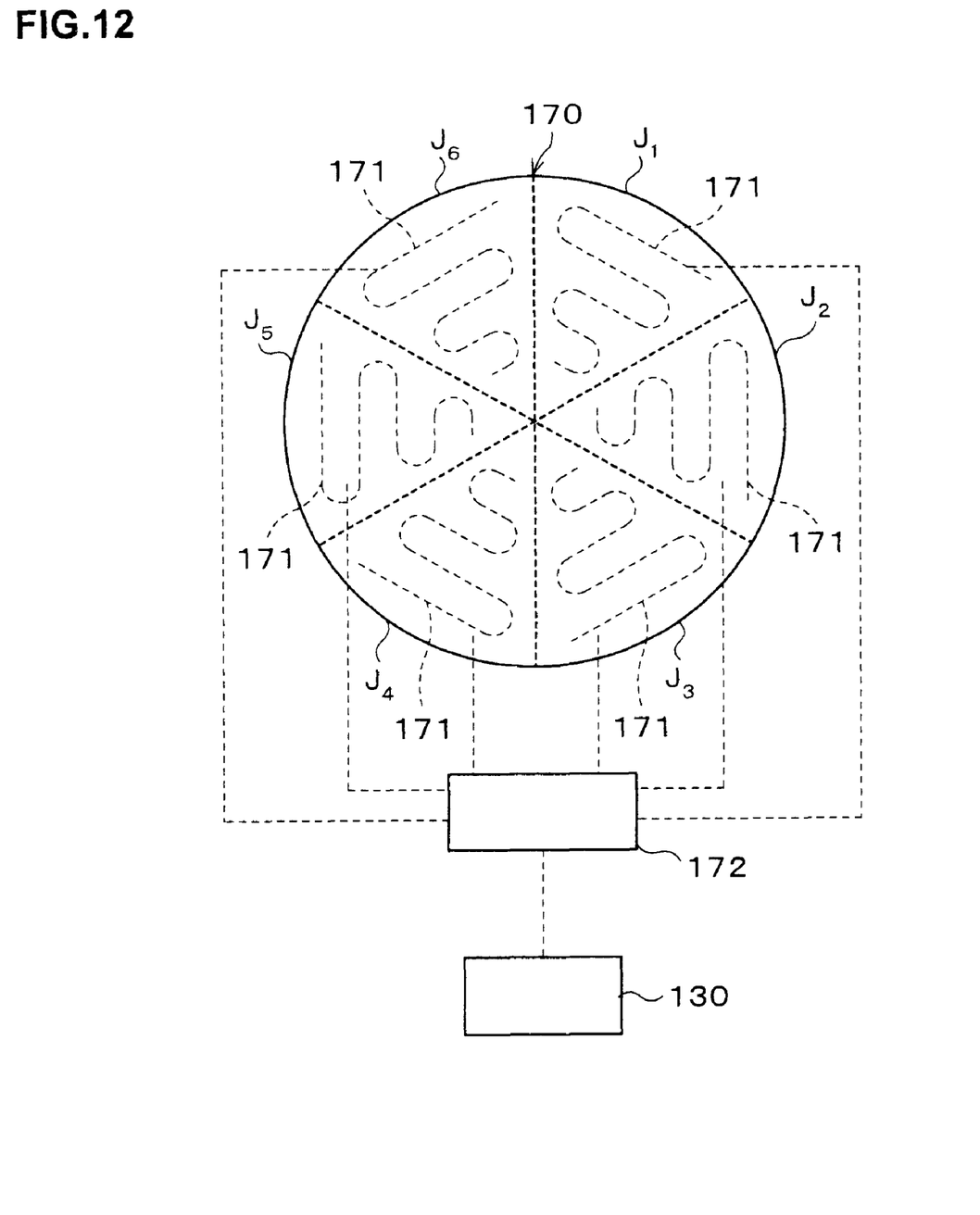
FIG. 12 is a plan view showing a configuration of a thermal plate in the PEB unit.

At the center of the thermal plate accommodating unit 161, a thermal plate 170 is provided as a thermal processing plate for mounting and heating the wafer W thereon. The thermal plate 170 has an almost disk shape with a large thickness. The thermal plate 170 is partitioned into a plurality of, for example, six thermal plate regions $J_1$, $J_2$, $J_3$, $J_4$, $J_5$, and $J_6$ as shown in FIG. 12. The thermal plate regions $J_1$ to $J_6$ are partitioned such that the thermal plate 170 is equally divided into six fan-like parts as seen from above.

A heater 171 generating heat by power supplying is individually embedded in each of the thermal plate regions $J_1$ to $J_6$ of the thermal plate 170 and can heat each of the thermal plate regions $J_1$ to $J_6$. The heating value of each of the heaters 171 of the thermal plate regions $J_1$ to $J_6$ is adjusted, for example, by a temperature controller 172. The temperature setting in the temperature controller 172 is performed, for example, by the controller 130.

As shown in FIG. 10, first raising and lowering pins 180 for supporting the wafer W from below and raising and lowering the wafer W are provided below the thermal plate 170. The first raising and lowering pins 180 are vertically movable by means of a raising and lowering drive mechanism 181. Near the central portion of the thermal plate 170, through holes 182 are formed which pass through the thermal plate 170 in its thickness direction. The first raising and lowering pins 180 can rise from below the thermal plate 170 and pass through the through holes 182 to project to above the thermal plate 170.

The thermal plate accommodating unit 161 has an annular holding member 190 for accommodating the thermal plate 170 and holding the outer peripheral portion of the thermal plate 170, and a support ring 191 almost in a cylindrical shape surrounding the outer periphery of the holding member 190. The upper surface of the support ring 191 is formed with blow ports 191a for jetting, for example, an inert gas toward the inside of the processing chamber S. The jetting of the inert gas from the blow ports 191a can purge the processing chamber S. Further, outside the support ring 191, a case 192 in a cylindrical shape is provided which is an outer periphery of the thermal plate accommodating unit 191.

In the cooling section 152 adjacent to the heating section 151, for example, a cooling plate 200 is provided which mounts and cools the wafer W thereon. The cooling plate 200 has, for example, an almost square flat-plate shape as shown in FIG. 11 with its end face on the thermal plate 170 side curved in an arc shape. As shown in FIG. 10, inside the cooling plate 200, for example, a cooling member 200a such as a Peltier element is embedded and can adjust the cooling plate 200 to a predetermined set temperature.

The cooling plate 200 is attached to a rail 201 extending toward the heating section 151 side. The cooling plate 200 can move on the rail 201 by means of a drive unit 202 to a position above the thermal plate 170 on the heating section 151 side.

The cooling plate 200 is formed with, for example, two slits 203 along the X-direction, for example, as shown in FIG. 11. The slits 203 are formed from the end surface on the heating section 151 side of the cooling plate 200 to the vicinity of the central portion of the cooling plate 200. The slits 203 prevent the cooling plate 200 which has moved to the heating section 151 side from interfering with the first raising and lowering pins 180 projecting to above the thermal plate 170. As shown in FIG. 10, second raising and lowering pins 204 are provided below the cooling plate 200. The second raising and lowering pins 204 can be raised and lowered by a raising and lowering drive unit 205. The second raising and lowering pins 204 can rise from below the cooling plate 200 and pass through the slits 203 to project to above the cooling plate 200.

As shown in FIG. 11, both side walls of the housing 150 across the cooling plate 200 are formed with transfer-in/out ports 210 for transferring-in/out the wafer W.

In the PEB unit 84 configured as described above, a wafer W is first transferred-in through the transfer-in/out port 210 and mounted on the cooling plate 200. The cooling plate 200 is subsequently moved so that the wafer W is moved to a position above the thermal plate 170. The wafer W on the cooling plate 200 is passed to the first raising and lowering pins 180 and mounted onto the thermal plate 170 by the first raising and lowering pins 180, so that the wafer W is heated. After a lapse of a predetermined time, the wafer W is then passed from the thermal plate 170 again to the cooling plate 200 and cooled thereon, and transferred from the cooling plate 200 to the outside of the PEB unit 84 through the transfer-in/out port 210, with which a series of thermal processing ends.

The adjustment of the set temperature of the thermal plate 170 in the PEB unit 84 configured as described above is performed, for example, using the above-described control unit 130. For example, the control unit 130 is connected to the temperature controller 172 for the thermal plate 170 as shown in FIG. 10 and FIG. 12.

Next, the temperature setting process for the PEB unit 84 using the above-described line width measurement results will be described.

First of all, the line width measurement results of the six wafers $W_1$ to W6 in the line width measuring unit 110, for example, are outputted to the controller 130, and the line width measurement results are combined in the controller 130, whereby the line widths at the 36 locations within the wafer are detected as described above. Next, average line width measured values $CD_1$, $CD_2$, $CD_3$, $CD_4$, $CD_5$, and $CD_6$ in the wafer regions $R_1$ to $R_6$ corresponding to the partitioned pattern of the thermal plate regions $J_1$ to $J_6$ are calculated in the controller 130. The average line width measured values $CD_1$ to $CD_6$ are obtained by averaging the line width measured values at the measurement points $Q_1$ to $Q_6$ in the wafer regions $R_1$ to $R_6$. Thereafter, an optimal temperature correction value $\Delta T$ for each of the thermal plate regions $J_1$ to $J_6$ is calculated by the following relational expression (1) based on each of the average line width measured values $CD_1$ to $CD_6$ in the wafer regions $R_1$ to $R_6$.

$$\Delta CD = M \cdot \Delta T \tag{1}$$

$\Delta CD$ is a line width change amount that is a difference between the average line width measured value $CD_1$ to $CD_6$ and a predetermined target line width set in advance. M is a correlation model created from a correlation between the previously obtained line width change amount $\Delta CD$ and the optimal temperature correction value $\Delta T$.

In the controller 130, temperature correction values $\Delta T_1$, $\Delta T_2$, $\Delta T_3$, $\Delta T_4$, $\Delta T_5$, and $\Delta T_6$ for the thermal plate regions $J_1$ to $J_6$ are calculated from the average line width measured values $CD_1$ to $CD_6$ using the relational expression (1).

Thereafter, the information on each of the temperature correction values $\Delta T_1$ to $\Delta T_6$ is outputted from the controller 130 to the temperature controller 172, and the set temperature for each of the thermal plate regions $R_1$ to $R_6$ of the thermal plate 170 in the temperature controller 172 is changed, whereby a new set temperature is set.

In this example, since the line width measurement results of the product wafers can be used for adjustment of the set temperatures of the thermal plate 170 in the PEB unit 84 that affects the line width, the line widths of the product wafers are measured without decreasing the throughput while the line widths can be improved.

Further, since the partitioned pattern of the thermal plate regions $J_1$ to $J_6$ for adjustment of the set temperatures corresponds to the wafer regions $R_1$ to $R_6$ into which the plurality of measurement points Q are divided, the line width measurement results measured in the wafer regions $R_1$ to $R_6$ can be used for calculation of the temperature correction values for the thermal plate regions $J_1$ to $J_6$ as they are to easily adjust the set temperatures of the thermal plate 170 in this example.

While the above embodiment is an example in which adjustment of the set temperatures of the thermal plate 170 in the PEB unit 84 is performed based on the line width measurement results within the wafer, the present invention is also applicable to a case when performing adjustment of the set temperatures of a thermal plate for performing other thermal processing provided in a pre-baking unit and a post-baking unit, and adjustment of set temperatures of a cooling plate in a cooling processing unit for cooling the wafer W.

A preferred embodiment of the present invention has been described above with reference to the accompanying drawings, and the present invention is not limited to the embodiment. It should be understood that various changes and modifications within the scope of the spirit as set forth in claims are readily apparent to those skilled in the art, and those should also be covered by the technical scope of the present invention.

For example, while the plurality of measurement points Q within the wafer are divided corresponding to six wafer regions $R_1$ to $R_6$ in the above-described embodiment, the umber of division can be arbitrarily selected. Further, the partitioned pattern of the wafer regions $R_1$ to $R_6$ may be another pattern. Furthermore, it is not always necessary to partition the wafer into the wafer regions and divide the measurement points thereto, but a plurality of measurement points within the wafer may be extracted and divided in a random manner.

Further, while the line widths within the wafer are measured in the above embodiment, other processing states within the wafer, such as the angle of the side wall (the sidewall angle) in the groove of the resist pattern and the film thickness of the resist pattern may be measured. Furthermore, the present invention is also applicable to measurement of substrates other than the wafer, such as an FPD (Flat Panel Display) and the like.

The present invention is useful in measuring product substrates without decreasing the throughput of processing of the product substrates.

What is claimed is:

1. A measuring method, implemented by a control unit that has been programmed with instructions that cause the control unit to function as a substrate measuring system, of measuring processing states of a plurality of substrates, the substrates having been successively transferred and subjected to processing, said method comprising the steps of:

dividing a plurality of measurement points within each of the plurality of substrates into a plurality of regions in advance;

measuring the processing states at only one of the plurality of regions for each of the plurality of substrates, such that a different measured region is measured on a different substrate of the plurality of substrates and a number of the plurality of regions corresponds to a number of the plurality of substrates; and combining measurement results at the measurement points of the plurality of substrates so there is no overlapping portion and the measurement results over the entire surface of one substrate is obtained, wherein the plurality of substrates are a plurality of physical wafers.

2. The measuring method as set forth in claim 1, wherein a measurement point common to the substrates is set in the measurement points of each of the substrates, wherein an average value of measurement results at the measurement point common to the substrates is calculated, and wherein measurement errors between the substrates are corrected based on differences between the average value and the measurement results at the measurement point common to the substrates.

3. The measuring method as set forth in claim 1, wherein when a plurality of processing units are provided each for performing a specific step of the processing and the plurality of substrates transferred in succession are processed separately in the processing units, the measurements at the measurement points divided into the plurality of regions are performed using a plurality of substrates processed in a same processing unit, and measurement results at the measurement points of the plurality of substrates are combined.

4. The measuring method as set forth in claim 1, wherein the processing includes processing of mounting and thermally processing the substrate on a thermal processing plate, wherein the thermal processing plate is partitioned into a pattern of a plurality of thermal processing plate regions and a temperature is settable for each of the thermal processing plate regions, and wherein the plurality of measurement points divided into the plurality of regions within each of the plurality of substrates are divided to correspond to the partitioned pattern of the thermal processing plate.

5. The measuring method as set forth in claim 1, wherein the processing includes processing of mounting and thermally processing the substrate on a thermal processing plate, wherein the thermal processing plate is partitioned into a pattern of a plurality of thermal processing plate regions and a temperature is settable for each of the thermal processing plate regions, wherein the measurements of the processing states of the plurality of substrates are performed to adjust set temperatures of the thermal processing plate regions, and wherein correction values for the set temperatures of the thermal processing plate regions are calculated based on the measurement results at the plurality of measurement points divided into the plurality of regions within the substrate.

6. A computer-readable recording medium recording a computer program thereon for causing a computer to control a substrate measuring method performed in a substrate measuring system, said substrate measuring method being a measuring method of measuring processing states of a plurality of substrates, the substrates having been successively transferred and subjected to processing, said method further comprising the steps of:

dividing a plurality of measurement points within each of the plurality of substrates into a plurality of regions in advance;

measuring the processing states at only one of the plurality of regions for each of the plurality of substrates, such that a different measured region is measured on a different substrate of the plurality of substrates and a number of the plurality of regions corresponds to a number of the plurality of substrates; and combining measurement results at the measurement points of the plurality of substrates so there is no overlapping portion and the measurement results over the entire surface of one substrate is obtained, wherein the plurality of substrates are a plurality of physical wafers.

7. The computer readable medium of claim 6, wherein a measurement point common to the substrates is set in the measurement points of each of the substrates, wherein an average value of measurement results at the measurement point common to the substrates is calculated, and wherein measurement errors between the substrates are corrected based on differences between the average value and the measurement results at the measurement point common to the substrates.

* * * * *